United States Patent
Franka et al.

Patent Number: 5,351,419
Date of Patent: Oct. 4, 1994

[54] METHOD FOR VAPOR DRYING

[75] Inventors: John G. Franka; Gary A. DePinto; Ross A. Fisher; Harry S. Morgan, all of Austin, Tex.

[73] Assignee: Motorola, Inc., Schaumburg, Ill.

[21] Appl. No.: 920,074

[22] Filed: Jul. 27, 1992

[51] Int. Cl.⁵ .............................................. F26B 21/06
[52] U.S. Cl. ......................................... 34/470; 34/78
[58] Field of Search ................. 34/77, 78, 13, 22, 73, 34/34, 37, 12, 470

[56] References Cited

U.S. PATENT DOCUMENTS 5,249,371 10/1993 Saito .................................. 34/78 X

FOREIGN PATENT DOCUMENTS 63-266833 11/1988 Japan .
0110929 4/1990 Japan .................................... 34/12
2224639A 5/1990 United Kingdom .

Primary Examiner—Henry A. Bennett
Attorney, Agent, or Firm—Kent J. Cooper

[57] ABSTRACT

A multi-directional flow of isopropyl alcohol vapor is used to uniformly dry a semiconductor substrate. In one embodiment of the invention, isopropyl alcohol vapor (19), which is generated by an external vapor source (30), is injected into the vapor drying system at a location near the top portion (28) of the semiconductor substrate (20), while internally generated isopropyl alcohol vapors (18) are directed toward the bottom portion (26) of the semiconductor substrate (20). Therefore, both the top (28) and the bottom (26) portions of the semiconductor substrate (20) are dried at approximately the same time.

2 Claims, 1 Drawing Sheet ly present on semiconductor substrate 20. The azeotropic mixture drips from the bottom portion 26 of semiconductor substrate 20 and is carried to a drain, removing the liquid that was originally present on semiconductor substrate 20. When drying medium vapors 18 and 19 no longer condense on semiconductor substrate 20, then semiconductor substrate 20 is removed from the vapor drying system.

METHOD FOR VAPOR DRYING

FIELD OF THE INVENTION

This invention relates generally to vapor drying, and more specifically to the vapor drying of semiconductor substrates.

BACKGROUND OF THE INVENTION

Vapor drying of semiconductor substrates with isopropyl alcohol (IPA) is widely used in the semiconductor industry. In a typical IPA vapor dryer, semiconductor substrates, wet with de-ionized water, are introduced into a quartz tank containing a cloud of vaporized IPA. The substrates are typically oriented vertically, in a front-to-back relationship. A resistive heater, mounted to the bottom of the quartz tank, is used to heat a reservoir of liquefied IPA and thus generate the IPA vapor cloud. When the warm IPA vapor comes into contact with the cool semiconductor substrates, IPA condenses out on the substrates and forms an azeotropic mixture with the de-ionized water. The azeotropic mixture has a reduced surface tension that allows it to flow off the substrates, and thus remove de-ionized water from the semiconductor substrates. Unfortunately, the semiconductor substrates are not always adequately dried by this process.

The introduction of the wet semiconductor substrates into the quartz tank causes the IPA vapor cloud to collapse or re-equilibrate through condensation. Naturally, the IPA vapor cloud is restored first at the bottom of the quartz tank, which is closest to the resistive heat source. Consequently, the azeotropic mixture, which is essential to the drying process, is formed first on those portions of the semiconductor substrate that are located near the bottom of the tank. The azeotropic mixture progresses upward on the substrates, in tandem with the restored IPA vapor cloud. Thus the semiconductor substrates are dried in a bottom to top manner. The restored IPA vapor cloud, however, does not always come into contact with the de-ionized water on the upper portions of the semiconductor substrates, and subsequently form an azeotropic mixture, before the de-ionized water evaporates, forming water spots on the upper portions of the semiconductor substrate. These water spots negatively affect semiconductor device yields and reliability. Additionally, this problem is aggravated by the ever increasing size of semiconductor substrates. Accordingly, a need exists for an IPA vapor drying process that uniformly and reproducibly dries semiconductor substrates, independent of their size.

SUMMARY OF THE INVENTION

The previously mentioned problems with existing vapor drying processes are overcome by the present invention. In one embodiment of the invention, an object is vapor dried by placing the object within a tank. The object has a top and a bottom. The object is exposed to a vapor of a drying medium. The vapor of the drying medium is directed toward both the top and the bottom of the object. The vapor of the drying medium condenses on and drips from the bottom of the object, carrying away another liquid that was present on the object.

These and other features, and advantages, will be more clearly understood from the following detailed description taken in conjunction with the accompanying drawings. It is important to point out that the illustrations may not necessarily be drawn to scale, and that there may be other embodiments of the present invention that are not specifically illustrated.

DETAILED DESCRIPTION OF A PREFERRED EMBODIMENT

Figure 1:
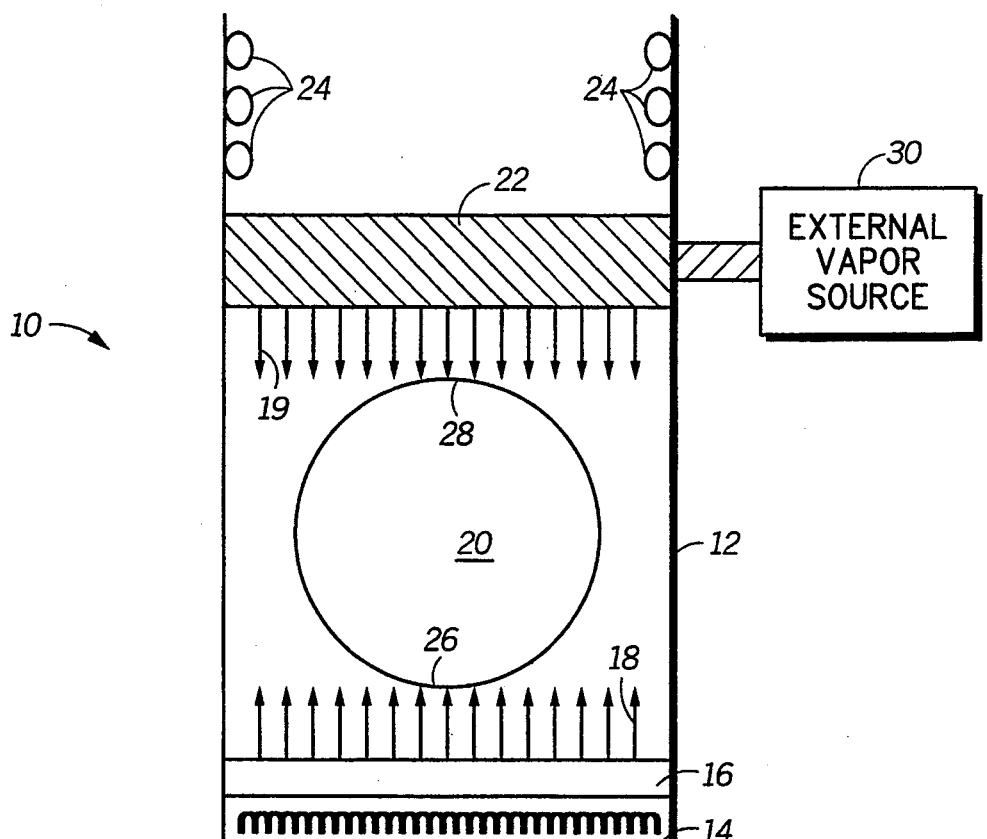
FIG. 1 illustrates, in cross-section, a vapor drying system suitable for implementing a process in accordance with one embodiment of the invention.
Figure 2:
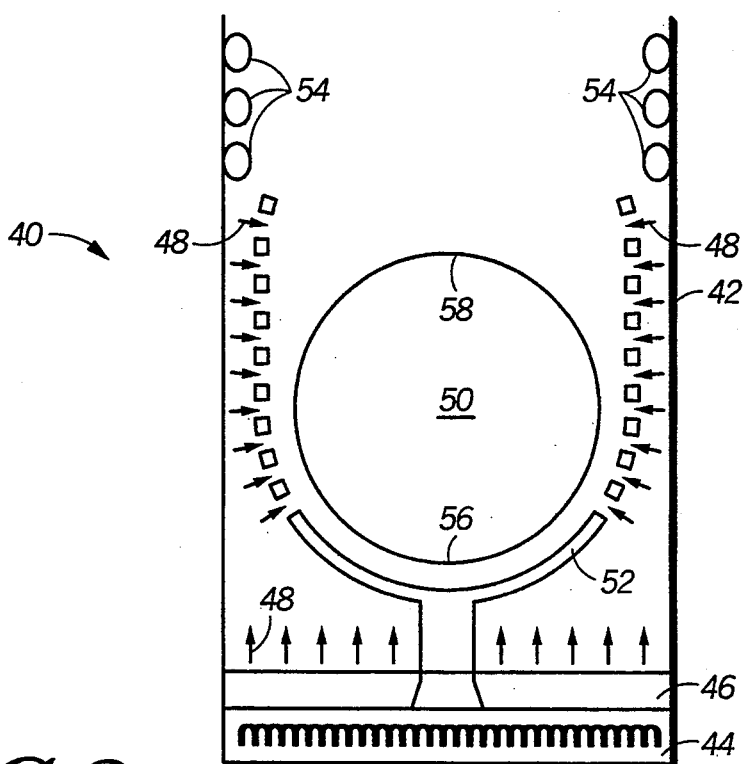
FIG. 2 illustrates, in cross-section, a vapor drying system suitable for implementing a process in accordance with another embodiment of the invention.

Shown in FIG. 1 is a portion 10 of a vapor drying system comprising a quartz tank 12, a resistive heater 14, a liquefied drying medium 16, drying medium vapors 18 and 19, a semiconductor substrate 20, a vapor manifold 22, cooling coils 24, and an external vapor source 30. Liquefied drying medium 16 is preferably ultra pure isopropyl alcohol. A vapor drying process in accordance with one embodiment of the invention entails the following steps. A semiconductor substrate 20, which is wet with a liquid, is placed vertically into quartz tank 12. Liquefied drying medium 16, which is lying at the bottom surface of quartz tank 12, is heated by resistive heater 14 such that it boils and generates drying medium vapors 18 that are directed toward the bottom portion 26 of semiconductor substrate 20. Additionally, drying medium vapors 19 generated by external vapor source 30 are injected into manifold 22 and directed toward the top portion 28 of semiconductor substrate 20. Drying medium vapors 18 and 19 condense on semiconductor substrate 20 and form an azeotropic mixture with the liquid original Shown in FIG. 2 is a portion 40 of a vapor drying system comprising a quartz tank 42, a resistive heater 44, a liquefied drying medium 46, drying medium vapors 48, a semiconductor substrate 50, cooling coils 54, and a perforated quartz insert 52. Liquefied drying medium 46 is preferably ultra pure isopropyl alcohol. A vapor drying process in accordance with a second embodiment of the invention entails the following steps. A semiconductor substrate 50, which is wet with a liquid, is placed vertically into quartz tank 42 and within perforated quartz insert 52. Liquefied drying medium 46, which is lying at the bottom surface of quartz tank 42, is heated by resistive heater 44 such that it boils and generates drying medium vapors 48. Drying medium vapors 48 are guided by perforated quartz insert 52 such that the vapor flow is directed toward both the bottom portion 56 and the top portion 58 of semiconductor substrate 50, as shown in FIG. 2. The bottom portion of perforated quartz insert 52 is not perforated so that drying medium vapor 48 is forced to move upward and is channeled around semiconductor substrate 50. Drying medium vapors 48 condense on semiconductor substrate 50 and form an azeotropic mixture with the liquid originally present on semiconductor substrate 50. The azeotropic mixture drips from the bottom portion 56 of semiconductor substrate 50 and is carried to a drain, removing the liquid that was originally present on semiconductor substrate 50. When drying medium vapors 48 no longer condense on semiconductor substrate 50, then semiconductor substrate 50 is removed from the vapor drying system.

The foregoing description and illustrations contained herein demonstrate many of the advantages associated with the present invention. One advantage is that vapor from the drying medium contacts both the upper and lower portions of the semiconductor substrate nearly simultaneously. Consequently, vapor condensation and the subsequent formation of the azeotropic mixture occurs rapidly on both the upper and lower portions of the semiconductor substrate at essentially the same time. Thus, the entire semiconductor substrate is quickly covered by the azeotropic mixture, which is essential to the drying process, and the semiconductor substrate is uniformly dried. Moreover, not only does this multi-directional drying process allow large semiconductor substrates to be dried, but it also minimizes the time required to dry them.

Thus it is apparent that there has been provided, in accordance with the invention, a method for vapor drying that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, vapor, which is generated externally, could also be injected at multiple locations around the semiconductor substrate, such as near the top and bottom of the semiconductor substrate and along the walls of the quartz tank. In addition, the invention is not limited to the materials specifically described. Although preferred materials have been recited it is envisioned that numerous materials may be suitable for the different elements of the present invention. For example, drying mediums other than IPA can be used and objects other than semiconductor substrates could be dried. Therefore, it is intended that this invention encompass all such variations and modifications as fall within the scope of the appended claims.

We claim:

1. A method for vapor drying comprising the steps of:
providing a tank, the tank having a bottom surface, a side, and at least one cooling coil, wherein the at least one cooling coil is mounted to the side of the tank;
providing a semiconductor substrate, the semiconductor substrate having a liquid present thereon, and having a top portion and a bottom portion;
providing liquefied isopropyl alcohol along the bottom surfaces of the tank;
placing the semiconductor substrate within the tank, wherein the semiconductor substrate overlies the liquefied isopropyl alcohol;
injecting an externally generated isopropyl alcohol vapor into the tank, wherein the externally generated isopropyl vapor is injected into the tank at a location below the at least one cooling coil;
heating the liquefied isopropyl alcohol to generate isopropyl alcohol vapor near the bottom portion of the semiconductor substrate; and
condensing the isopropyl alcohol vapor on the semiconductor substrate to remove the liquid from the semiconductor substrate.

2. A method for vapor drying comprising the steps of:
providing a tank, the tank having a perforated insert lying therein, and a bottom surface;
providing a semiconductor substrate, the semiconductor substrate having a liquid present thereon, and having a top portion and a bottom portion and a major surface;
providing liquefied isopropyl alcohol along the bottom surface of the tank;
placing the semiconductor substrate within the tank such that the major surface of the semiconductor substrate is nearly perpendicular to the bottom surface of the tank, wherein the semiconductor substrate overlies the liquefied isopropyl alcohol and lies within the perforated insert;
heating the liquefied isopropyl alcohol to generate an isopropyl alcohol vapor near the bottom surface of the tank, wherein the perforated insert channels the isopropyl alcohol vapor uniformly around the semiconductor substrate such that the bottom portion and the top portion of the semiconductor substrate are exposed to the isopropyl alcohol vapor nearly simultaneously; and
condensing the isopropyl alcohol vapor on the top portion and the bottom portion of the semiconductor substrate to remove the liquid from the semiconductor substrate.

* * * * *